(12) United States Patent
Hashimoto et al.

(10) Patent No.: US 6,669,809 B2
(45) Date of Patent: Dec. 30, 2003

(54) APPARATUS FOR REMOVING A COATING FILM

(75) Inventors: Yoshiaki Hashimoto, Tokyo (JP); Yasuyuki Sato, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 98 days.

(21) Appl. No.: 09/791,793

(22) Filed: Feb. 26, 2001

(65) Prior Publication Data

US 2001/0017191 A1 Aug. 30, 2001

(30) Foreign Application Priority Data

Feb. 25, 2000 (JP) .......................... 2000-050249

(51) Int. Cl.[7] .............................. B05B 3/00; B08B 3/00
(52) U.S. Cl. ..................... 156/345.2; 134/113
(58) Field of Search ....................... 156/345.2; 134/902, 134/113

(56) References Cited

U.S. PATENT DOCUMENTS

| | | | | |
|---|---|---|---|---|
| 4,611,553 A | * | 9/1986 | Iwata et al. ............... | 118/50 |
| 5,871,584 A | * | 2/1999 | Tateyama et al. .......... | 118/323 |
| 5,997,653 A | * | 12/1999 | Yamasaka ................. | 134/2 |
| 6,114,254 A | * | 9/2000 | Rolfson .................... | 438/758 |
| 6,247,479 B1 | * | 6/2001 | Taniyama et al. ......... | 134/95.2 |

FOREIGN PATENT DOCUMENTS

| | | |
|---|---|---|
| JP | 1-253923 | 10/1989 |
| JP | 11-260702 | 9/1999 |
| JP | 2001-050660 | * 2/2001 |

* cited by examiner

*Primary Examiner*—Gregory Mills
*Assistant Examiner*—Sylvia R. MacArthur
(74) *Attorney, Agent, or Firm*—Young & Thompson

(57) ABSTRACT

A slit type blow nozzle 14 for ejecting a blow gas 1 and a slit type chemical rinse nozzle 12 for ejecting a rinse chemical 2 are arranged such that the blow gas removes a coating film dissolved by the chemical rinse from the end surface of a glass substrate.

16 Claims, 12 Drawing Sheets

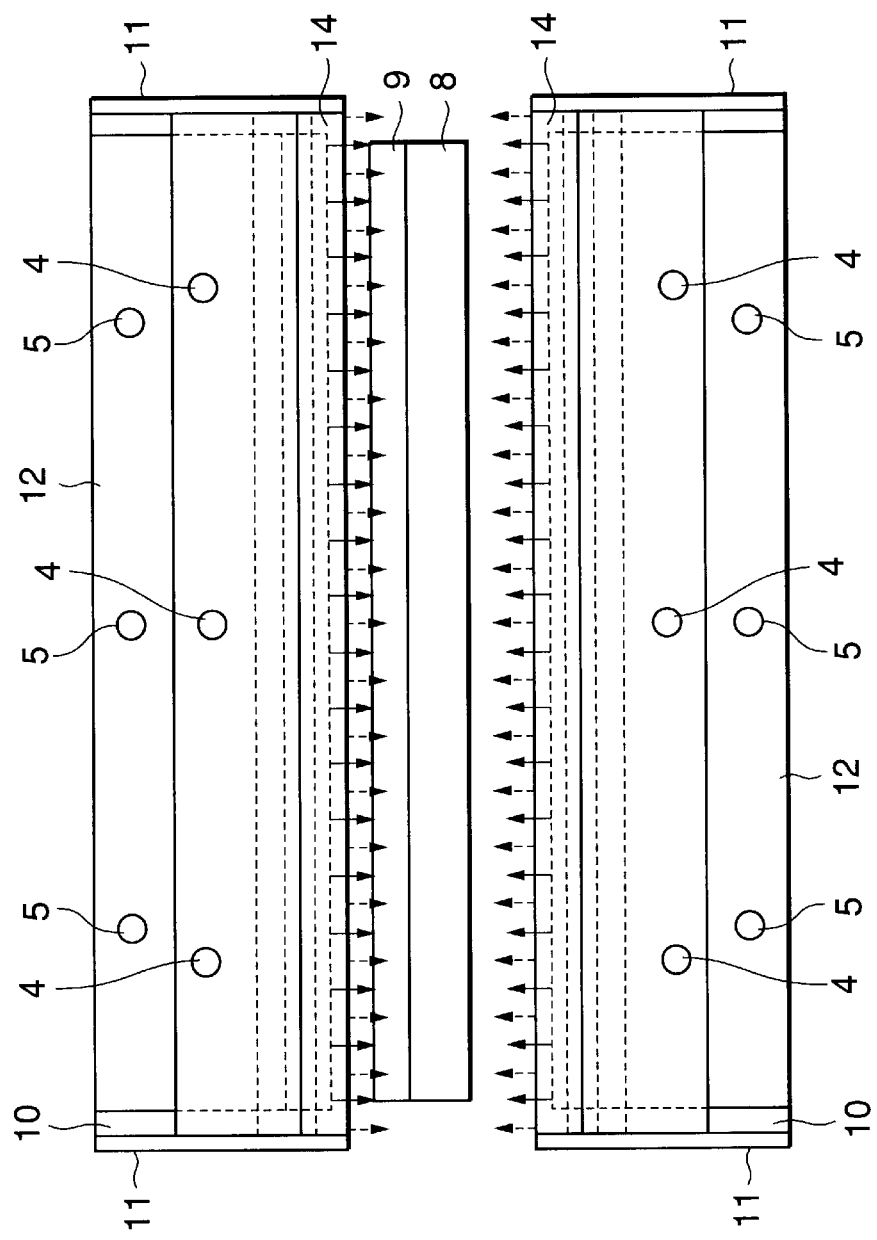

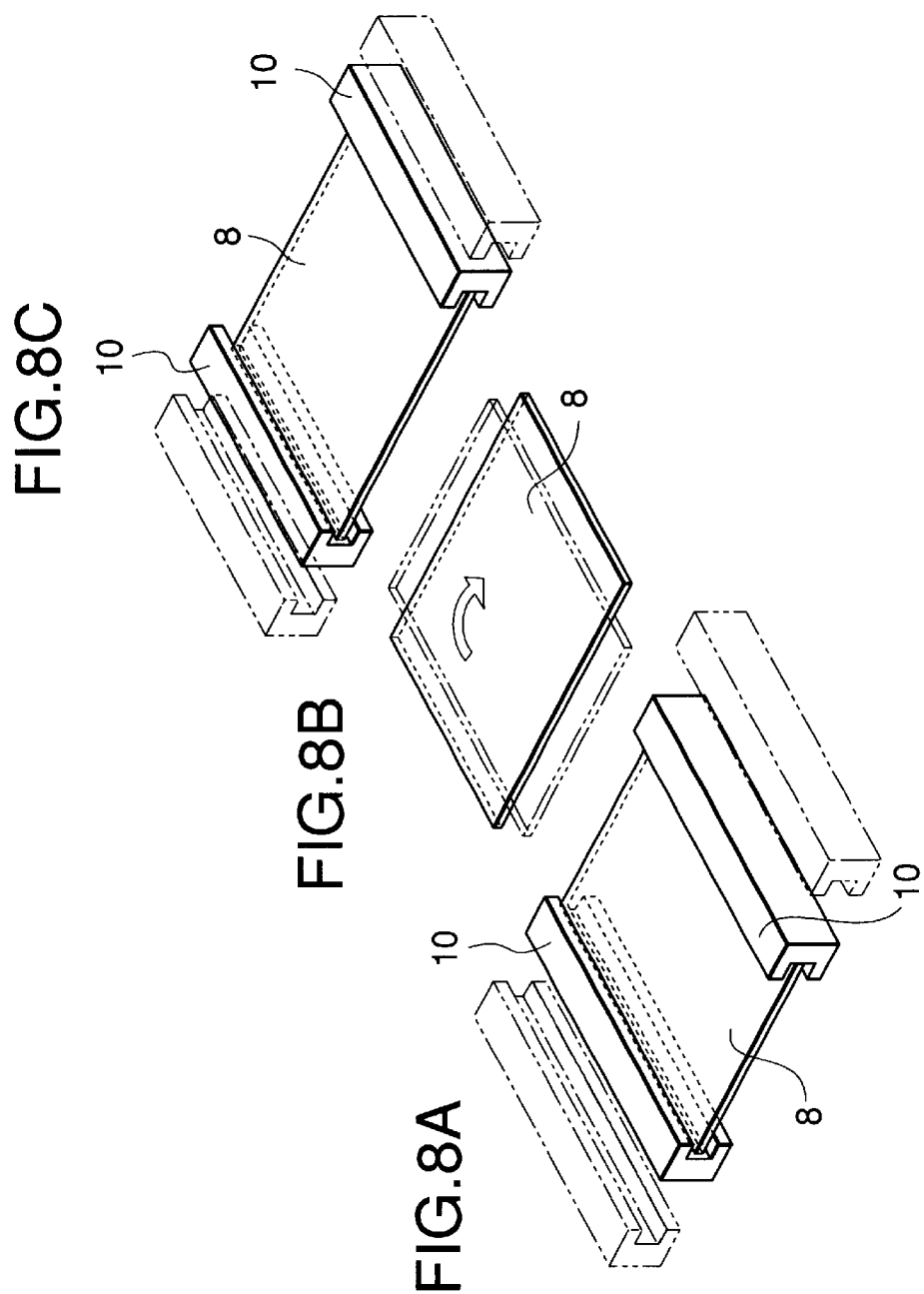

APPARATUS FOR REMOVING A COATING FILM

BACKGROUND OF THE INVENTION

1. Field of the Invention

The present invention relates to an apparatus for removing a coating film, such as a photoresist, formed on a substrate. More particularly, it relates to an apparatus for removing a coating film around the perimeter of the end surface of a display panel substrate.

2. Description of the Prior Art

As an apparatus for removing a photoresist film around the perimeter of the end surface of a substrate, an apparatus for removing the coating film on a semiconductor wafer in a semiconductor manufacturing process is known. For example, in Japanese Non-examined Patent Publication No. 1-253923, there is employed an EBR (Edge Bead Remover) head using two nozzles ejecting fluid.

In this publication, there is provided an EBR head equipped with a pin type blow nozzle having a nozzle diameter not greater than 1 mm near a pin type chemical rinse nozzle, thereby ejecting a chemical and $N_2$ gas at the same time. Employing this EBR head can prevent a coating film at an interface for removing the coating film from being swelled, so as to reduce lowered quality.

A conventional example 1 shown in FIGS. 10A and 10B applies the above-mentioned structure to a square glass substrate for use in manufacture of a liquid crystal display panel. There is provided with a drive means for moving EBR heads 10 in parallel along the perimeter of a glass substrate 8 formed with a resist film 9, and there is used the EBR head 10 having a plurality of pin type chemical rinse nozzles 17 and pin type blow nozzles 19 aligned thereon, thereby reducing the processing time. This is a conventional example of an apparatus using as a rinse chemical an organic solvent only, such as a thinner in general and is chiefly used for removing a positive photoresist film.

A conventional example 2 shown in FIG. 11 is an example of an apparatus for chiefly continuously processing a negative photoresist film using a chemical rinse and a pure water rinse and adds pin type pure water rinse nozzles 18 to the structure of the conventional example 1. An organic alkaline chemical is often used for this rinse chemical. Which conventional example 1 and 2 is selected depends on the compatibility of a coating film to be removed and the rinse chemical.

In either of the conventional examples 1 and 2, however, use of the pin type nozzles makes it impossible to eject the chemical at high pressure. This is because ejection of the chemical at high pressure will increase force acting inwardly of the substrate accordingly, and it is difficult for the pin type blow nozzle to cover all of the area. Lowering the chemical ejection pressure will weaken a physical force against the substrate surface, reducing the removing efficiency.

In order to thoroughly remove the resist film, it is necessary to reciprocate the EBR head itself several times or to process the film at low speed. Consequently, the processing time is longer and the amount of chemical or gas used is increased. Further, the blow nozzle only suppresses swelling of the removed part interface, and force of the chemical acting on the perimeter of the substrate highly depends on the exhaust ability. The thinner tends to remain on the end surface of the substrate, whereby the coating film component dissolved in the chemical remains on the substrate, adversely affecting the following process.

A conventional example 3 shown in FIG. 12 and a conventional example 4 shown in FIG. 13 are apparatuses using, as a method for removing a coating film, in place of the pin type chemical rinse nozzle, a dip type in which the end of the glass substrate 8 is placed in a rinse liquid 2 in a dip type chemical rinse portion 20. In this method, a new merit capable of linearly, uniformly removing the interface occurs. However, in a manner like the conventional examples 1 and 2, longer processing time is required due to the absence of the physical action, and the edge is likely to rise because the dissolution proceeds isotropically.

As described above, in the conventional examples 1 and 2, the processing time is longer and the amount of the chemical or gas used is increased. Further, in the conventional examples 3 and 4, in a manner like the conventional examples 1 and 2, longer processing time is required due to the absence of the physical action, and the edge is likely to rise because the dissolution proceeds isotropically.

These problems can be reduced to a usable level by adjusting a chemical used, processing time, the operation of the EBR itself, sequence, exhaust conditions and the like, but the problem that the process margin is small still remains.

SUMMARY OF THE INVENTION

An object of the present invention is to provide an apparatus for removing a coating film which meets an ability of uniformly removing the coating film and can remove the coating film fast.

A further object of the present invention, in addition to the above object, is to provide an apparatus for removing a coating film in which the amount of a chemical used is small, no liquid remains after processing, and a process margin is large.

According to the present invention, there is provided an apparatus for removing a coating film comprising a chemical rinse nozzle having an opening ejecting a chemical dissolving a coating film around the perimeter of the end surface of a substrate formed with the coating film, and a slit type blow nozzle having a slit opening ejecting gas to the substrate so as to remove the coating film dissolved by the chemical from the substrate.

The chemical rinse nozzle comprises a slit type chemical rinse nozzle having an opening in slit form. In the apparatus for removing a coating film provided with the slit type chemical rinse nozzle, the slit type chemical rinse nozzle is arranged between the slit type blow nozzle and the end of the substrate.

In such an apparatus for removing a coating film, the slit type blow nozzle and the slit type chemical rinse nozzle have a slit opening extending along one side of the substrate, respectively, the length of each opening being longer than one side of the substrate.

The slit type chemical rinse nozzle and the slit type blow nozzle may be of integrated nozzle construction, and the opening of the integrated nozzle construction may be single.

Furthermore, the apparatus for removing a coating film comprises a slit type pure water rinse nozzle having a slit opening ejecting pure water between the slit type blow nozzle and the slit type chemical rinse nozzle. The integration of the slit type pure water rinse nozzle and the slit type blow nozzle comprises a slit opening ejecting a mixture of the gas and the pure water.

The apparatus for removing a coating film according to the present invention comprises the first nozzle unit constructed by a combination of the slit type chemical rinse nozzle and the slit type blow nozzle, the second nozzle unit constructed by a combination of a slit type pure water rinse nozzle disposed adjacent to the slit type chemical rinse nozzle and having a slit opening ejecting pure water and the second slit type blow nozzle disposed adjacent to the slit type blow nozzle and having a slit opening ejecting gas, the first nozzle unit and the second nozzle unit being disposed adjacent each other along one side of the substrate, and carry means for carrying the substrate from the first nozzle unit to the second nozzle unit.

Such an apparatus for removing a coating film further comprises the third and the fourth nozzle units having the same construction as that of the first and the second nozzle units, the first and the third nozzle units being disposed to interpose one side of the substrate, and the second and the fourth nozzle units being disposed to interpose one side of the substrate.

The integration of the slit type chemical rinse nozzle and the slit type blow nozzle by being separated by a common partition comprises a slit type chemical rinse and blow nozzle provided with a slit opening ejecting the gas and the chemical independently.

The integration of the slit type pure water rinse nozzle and the slit type blow nozzle by being separated by a common partition comprises a slit type pure water rinse and blow nozzle provided with a slit opening ejecting the gas and the pure water independently.

A nozzle unit comprising the slit type chemical rinse and blow nozzle, and the slit type pure water rinse and blow nozzle is disposed so as to interpose one side of the substrate to be carried.

BRIEF DESCRIPTION OF THE DRAWINGS

FIG. 7 shows a front view of an EBR head according to the fifth embodiment of the present invention;

FIGS. 8A to 8C shows a perspective view to explain the operation according to another embodiment of the present invention;

DETAILED DESCRIPTION OF THE PREFERRED EMBODIMENTS

Figure 1A:
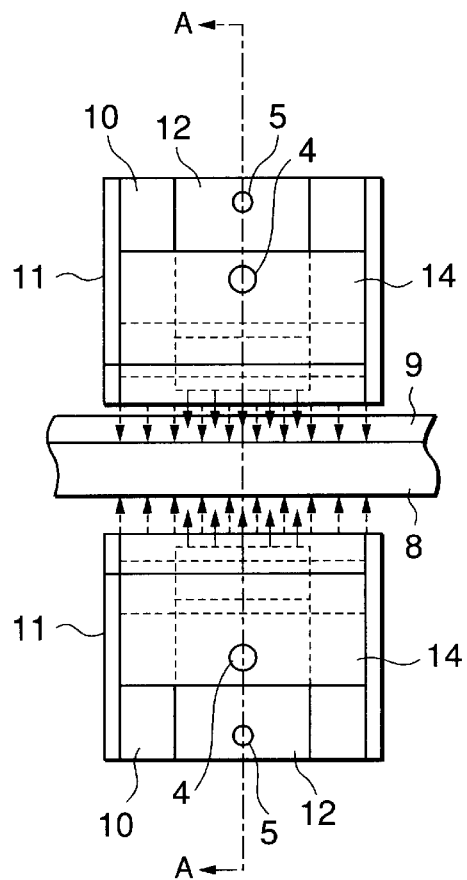
FIG. 1A shows a front view of an EBR head according to the first embodiment of the present invention.
Figure 1B:
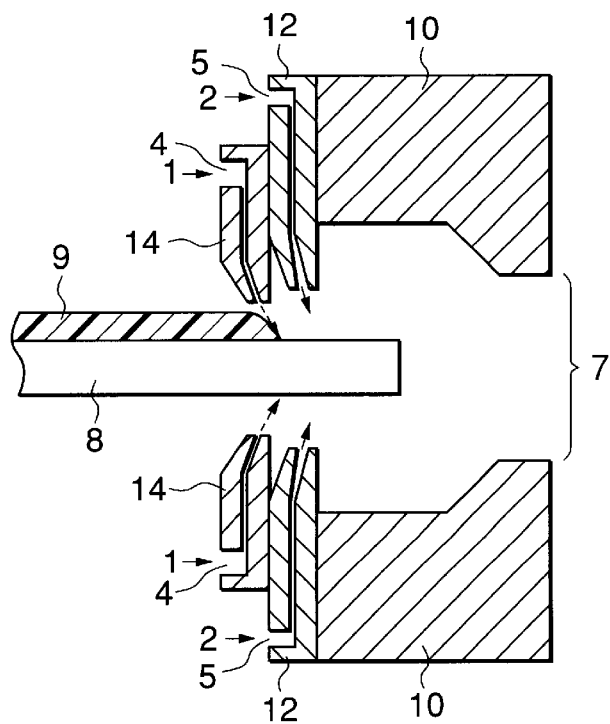
FIG. 1B shows a cross section taken on line A—A in FIG. 1A.

Referring to FIGS. 1A and 1B, an EBR head 10 according to the first embodiment of the present invention is provided in its rear portion with an exhaust 7 and in the upper and lower parts of its front portion with a pair of nozzles, respectively. The nozzle closer to the exhaust 7 is a slit type chemical rinse nozzle 12 ejecting a rinse chemical 2 in slit form, uniformly onto a glass substrate 8 coated with a resist film 9. The nozzle farther from the exhaust 7 is a slit type blow nozzle 14 ejecting a blow gas 1 in slit form, uniformly onto the glass substrate 8 and wider than the ejection effective width of the slit type chemical rinse nozzle 12.

Figure 2:
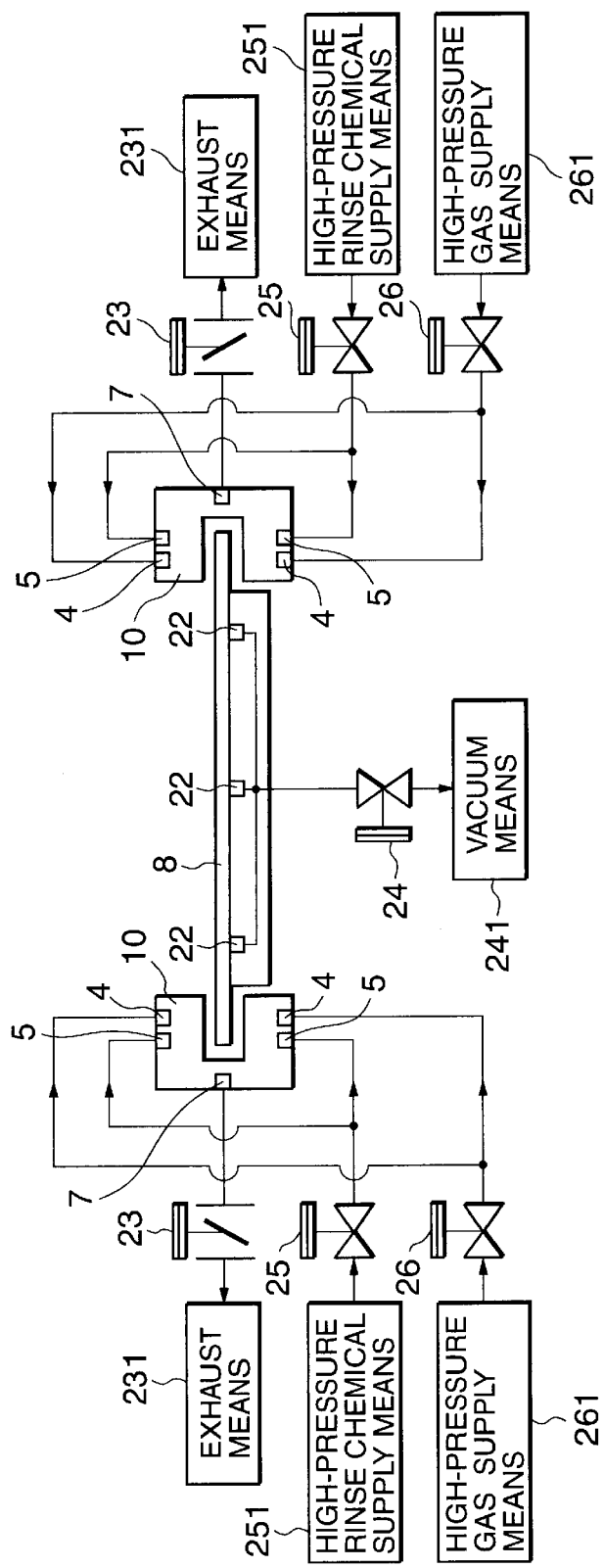
FIG. 2 shows a block diagram to explain the operation of an apparatus for removing a coating film according to the present invention.

As shown in FIG. 2, the slit type chemical rinse nozzle 12 is provided with a chemical supply 5 for supplying the rinse chemical 2 under high pressure by means of a pump or gas through an auto valve 26 supplying and stopping the chemical. The slit type blow nozzle 14 is provided with a gas supply 4 for supplying the high-pressure blow gas 1 from an auxiliary supply equipment through an auto valve 25 supplying and stopping the gas. The rinse chemical 2 and the blow gas 1 ejected from these nozzles are exhausted from the exhaust 7. The exhaust 7 is coupled to exhaust means 231 through an exhaust damper 23 opening and closing exhaust.

The side of the slit type blow nozzle 14 or the EBR head 10 is provided with an EBR sidewall 11 so as to minimize the exhaust opening area for preventing an atmosphere and mist from being leaked. A table 21 for mounting the glass substrate 8 is provided with a plurality of absorption holes 22 to which vacuum means 241 is connected through the auto valve 24, which absorbingly hold the glass substrate 8. Although not shown, there is provided a drive portion for moving the EBR heads 10 in parallel along the side of the substrate 8.

The width of the slit opening of the slit type nozzle depends on the viscosity of a fluid to be used, but preferably is approximately 0.3 mm or below for a solvent such as a thinner or a chemical such as an alkaline developing solution, and preferably is 0.2 mm or below for gas such as nitrogen gas.

In the above-mentioned embodiment, the chemical rinse nozzle 12 having a slit opening is described. When the blow nozzle 14 is of slit type, a pin type chemical rinse nozzle may be used instead of the slit type chemical rinse nozzle 12. In Japanese Non-examined Patent Publication No. 11-260702, there is disclosed that a slit type nozzle can be used as a nozzle ejecting a dissolving agent dissolving a thin film coated onto the substrate of a liquid crystal display. The publication neither discloses a blow nozzle for ejecting high-pressure gas nor suggests that the blow nozzle is of slit type.

Figure 3:
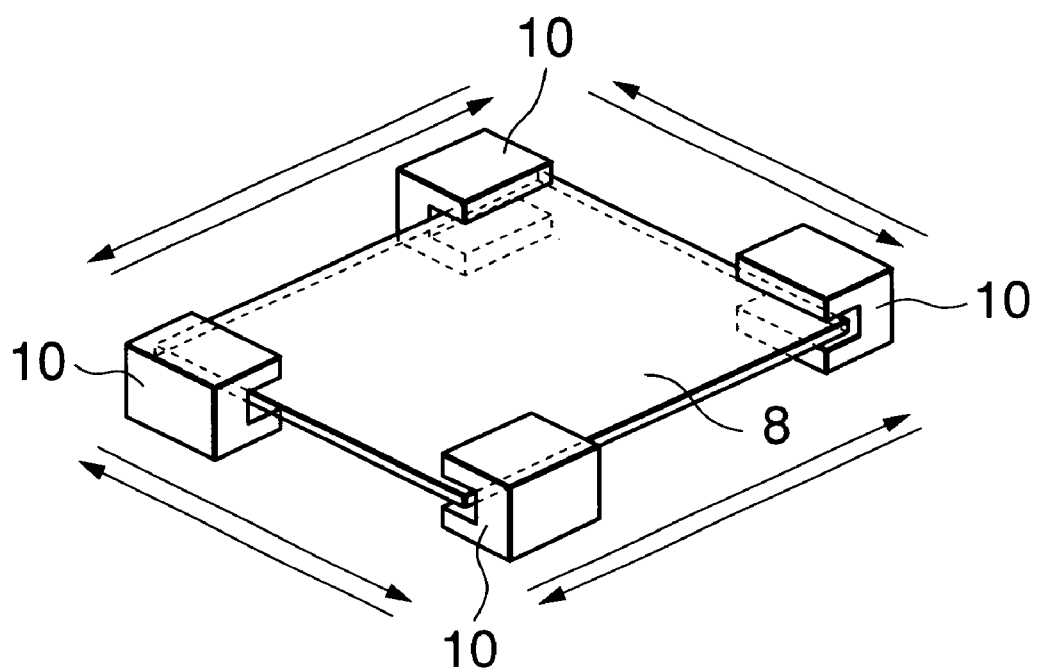
FIG. 3 shows a perspective view to explain the operation of one embodiment of the present invention.

Next, referring to FIGS. 2 and 3, the operation of the embodiment will be described. When the EBR heads 10 are in the standby position and the glass substrate 8 coated with the resist film 9 by a spin type coating apparatus is carried to the table 21 by substrate carry means, the auto valve 24 for absorbing the substrate is opened and the glass substrate 8 is absorbingly held to the table 21 through the absorption holes 22. As shown in FIG. 3, the four EBR heads 10 are moved to the position for starting a process of cleaning the end surface, and thereafter the exhaust damper 23 coupled to the exhaust means 231 is opened, starting exhaust in the EBR heads 10 through the exhaust 7. At the same time, the auto valve 26 for supplying gas coupled to high-pressure gas supply means 261 is opened such that the blow gas 1 is supplied through the gas supply 4 to the slit type blow nozzle 14, thereby starting ejecting gas. Simultaneously, the auto valve 25 for supplying the chemical coupled to high-pressure rinse chemical supply means 251 is opened, the rinse chemical 2 is supplied through the chemical supply 5 to the slit type chemical rinse nozzle 12, thereby starting ejecting the chemical, and then, the EBR heads 10 are moved in parallel along the perimeter of the glass substrate 8 while performing a process of cleaning the end surface thereof.

In order to control the process, the EBR heads are moved at a speed optionally set with a recipe, a program for the individual apparatuses about a process sequence and control parameters (control target values such as temperature, pressure, gas type, the rate of gas flow, and time) for the respective processing apparatuses, and perform the process a number of reciprocating times optionally set with the recipe likewise, as shown in FIG. 3. At the completion of this, the auto valve 25 for supplying the chemical is closed, thereby stopping the supply of the rinse chemical 2 through the chemical supply 5 to the slit type chemical rinse nozzle 12.

Then, the auto valve 26 for supplying gas is closed so as to stop the supply of the blow gas 1 through the gas supply 4 to the slit type blow nozzle 14. The exhaust damper 23 is closed so as to stop exhaust in the EBR heads 10 through the exhaust 7, and thereafter, the EBR heads 10 are moved to the standby position. The auto valve 24 for absorbing the substrate is closed so as to release the holding of the glass substrate 8 absorbed to the table 21, and the glass substrate 8 is carried to the following process by the carrying means.

In the first embodiment, the slit type blow nozzle covering a range more widely than the rinse nozzle is used for blowing at high pressure. Even when the slit type nozzle ejects the chemical at high pressure, no mist is scattered to the inside of the substrate, the physical action on the coating film is functioned so as to improve the efficiency. The amount of the liquid used is reduced, and the processing time is reduced.

Figure 4:
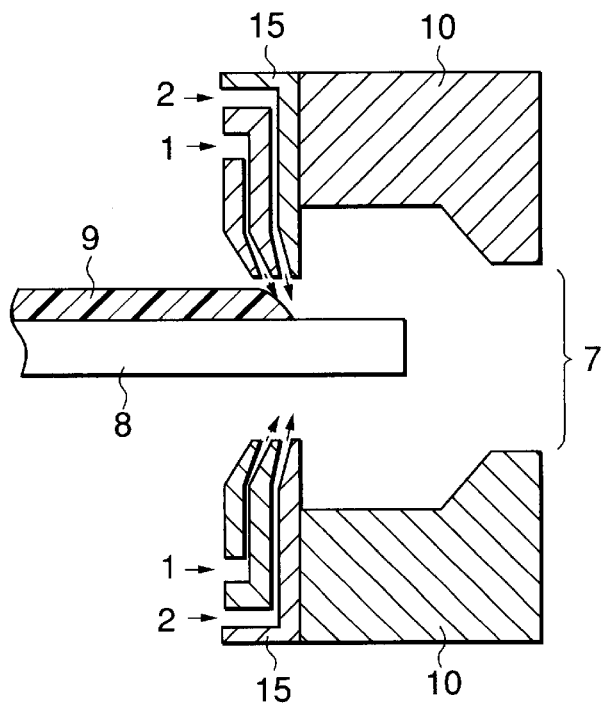
FIG. 4 shows a cross section of an EBR head according to the second embodiment of the present invention.

FIG. 4 is a cross section of an EBR head of assistance in explaining the second embodiment of the present invention.

The EBR head 10 is constructed by integrating the slit type chemical rinse nozzle and the slit type blow nozzle. In other words, the EBR head 10 is provided with a slit type chemical rinse and blow nozzle 15 with a common partition of both nozzles.

The second embodiment has the same effect as that of the first embodiment, making it possible to compact the EBR head and to reduce the number of parts.

Figure 5:
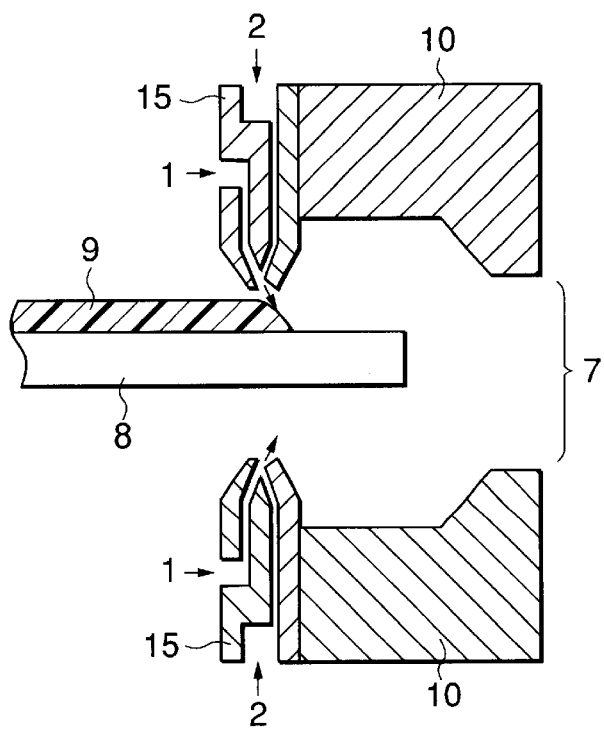
FIG. 5 shows a cross section of an EBR head according to the third embodiment of the present invention.

FIG. 5 is a cross section of an EBR head of assistance in explaining the third embodiment of the present invention. The EBR head is of two-fluid construction ejecting a mixture of gas and pure water. In other words, the EBR head is provided with a slit type chemical rinse and blow nozzle 15 having a single opening with a common slit opening.

Generally, in order to eject a liquid at high pressure, an expensive pressure pump is necessary. In this embodiment in which gas is supplied from the gas auxiliary equipment side at approximately 0.5 to 0.8 MPa in general, depending on the resist film type and other conditions, an object can be attained by scattering the liquid under pressure ejecting the high-pressure gas without the liquid supply itself at very high pressure. In addition to the effect of the first embodiment, therefore, the cost of the apparatus can be reduced.

Figure 6:
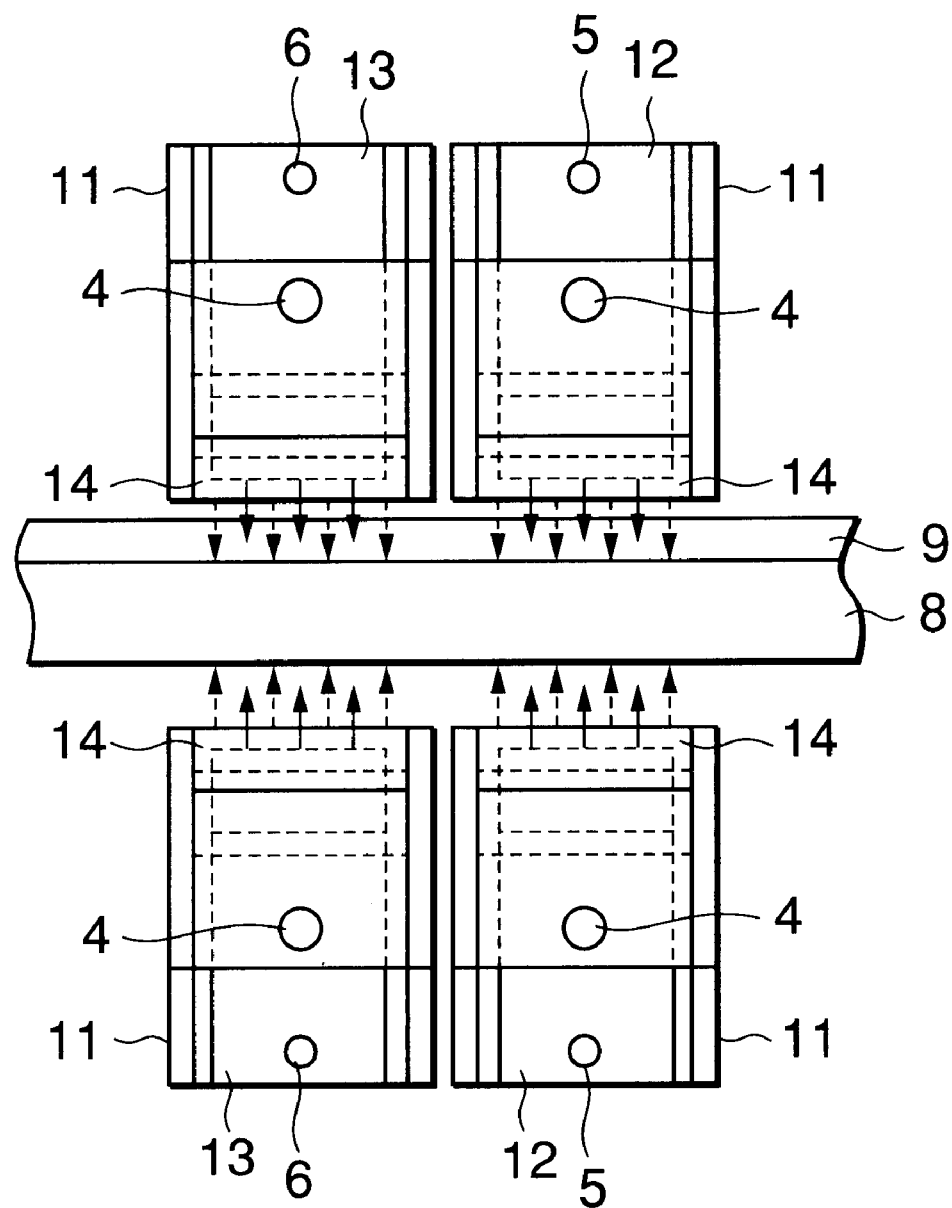
FIG. 6 shows a front view of an EBR head according to the fourth embodiment of the present invention.

FIG. 6 is a front view of an EBR head of assistance in explaining the fourth embodiment of the present invention.

In the fourth embodiment, first EBR units comprising the slit type chemical rinse nozzle 12 and the slit type blow nozzle 14, and second EBR units comprising a slit type pure water rinse nozzle 13 and the slit type blow nozzle 14 are disposed adjacent each other so as to interpose one side of the glass substrate 8 to be carried.

Often in the case of removing a negative resist film, an organic alkaline chemical or a mixture of an organic alkaline chemical solvent is typically used as the chemical rinse. The process requires pure water rinsing after chemical rinsing. The fourth embodiment is of construction of the EBR head 10 by envisaging the case. The process of removing a positive resist film uses an organic solvent as the chemical rinse and will not perform pure water rinsing after chemical rinsing. The first to third embodiments are used for removing a positive resist film.

FIG. 7 is a front view of an EBR head of assistance in explaining the fifth embodiment of the present invention. The width of the slit type blow nozzle 14 and the slit type chemical rinse nozzle 12 is longer than that of one side of the glass substrate 8.

In the fifth embodiment, as shown in FIG. 8A, the coating film of the opposed end surface portions of the glass substrate 8 is removed; as shown in FIG. 8B, the glass substrate 8 is rotated 90°; and subsequently, as shown in FIG. 8C, the coating film in another opposed end surface portions of the glass substrate 8 can be removed. Accordingly, the processing time for removing a positive resist film can chiefly be reduced as compared with the first to third embodiments and, in particular, there is provided a great effect of shortening tact time in the square substrate for a liquid crystal display that is becoming larger.

Figure 9A:
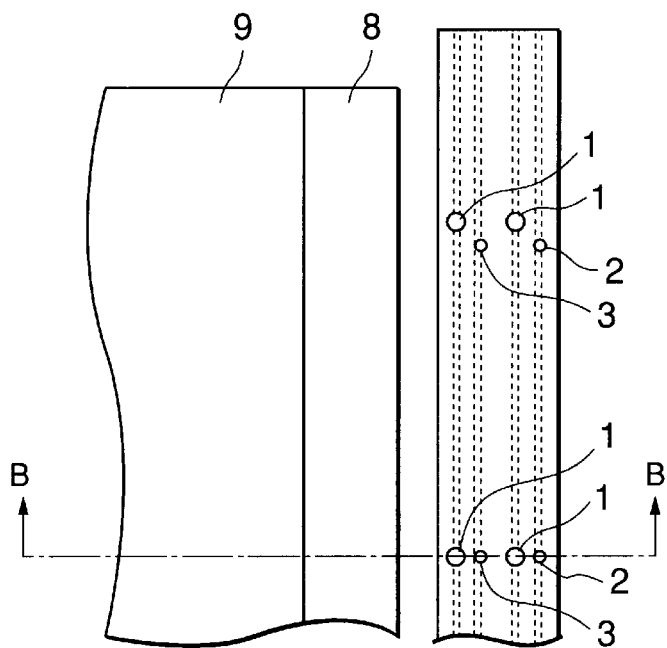
FIG. 9A shows a plan view of an EBR head according to the sixth embodiment of the present invention.
Figure 9B:
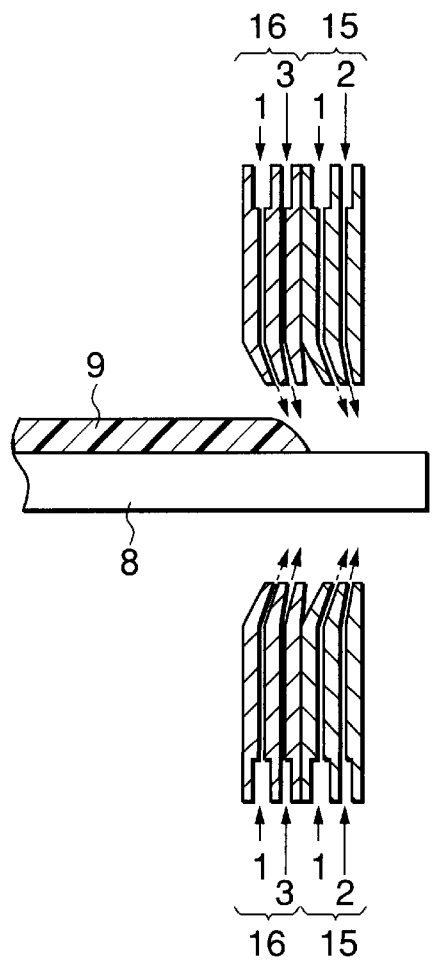
FIG. 9B shows a cross section taken on line B—B in FIG. 9A.
Figure 10A:
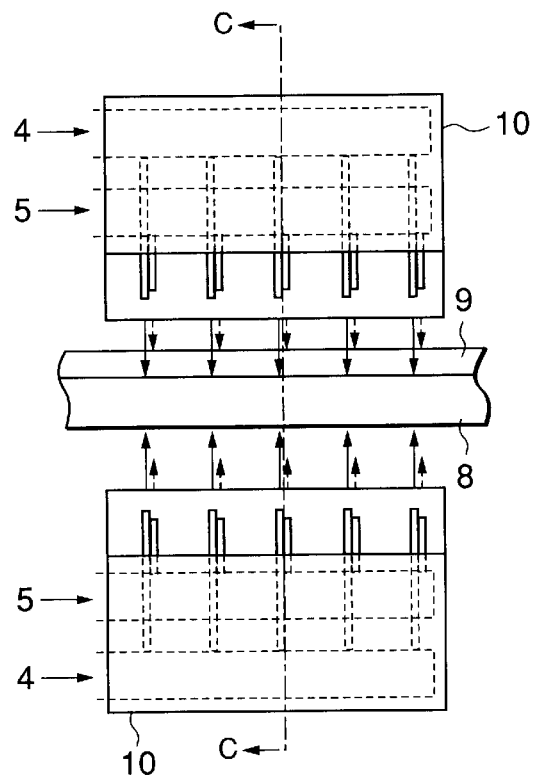
FIG. 10A shows a front view of an EBR head according to a conventional example 1.
Figure 10B:
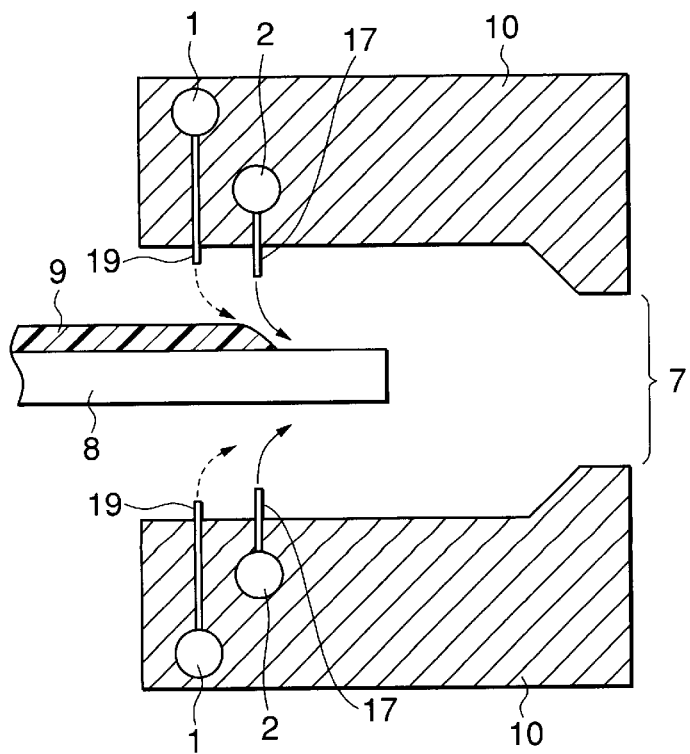
FIG. 10B shows a cross section taken on line C—C in FIG. 10A.
Figure 11:
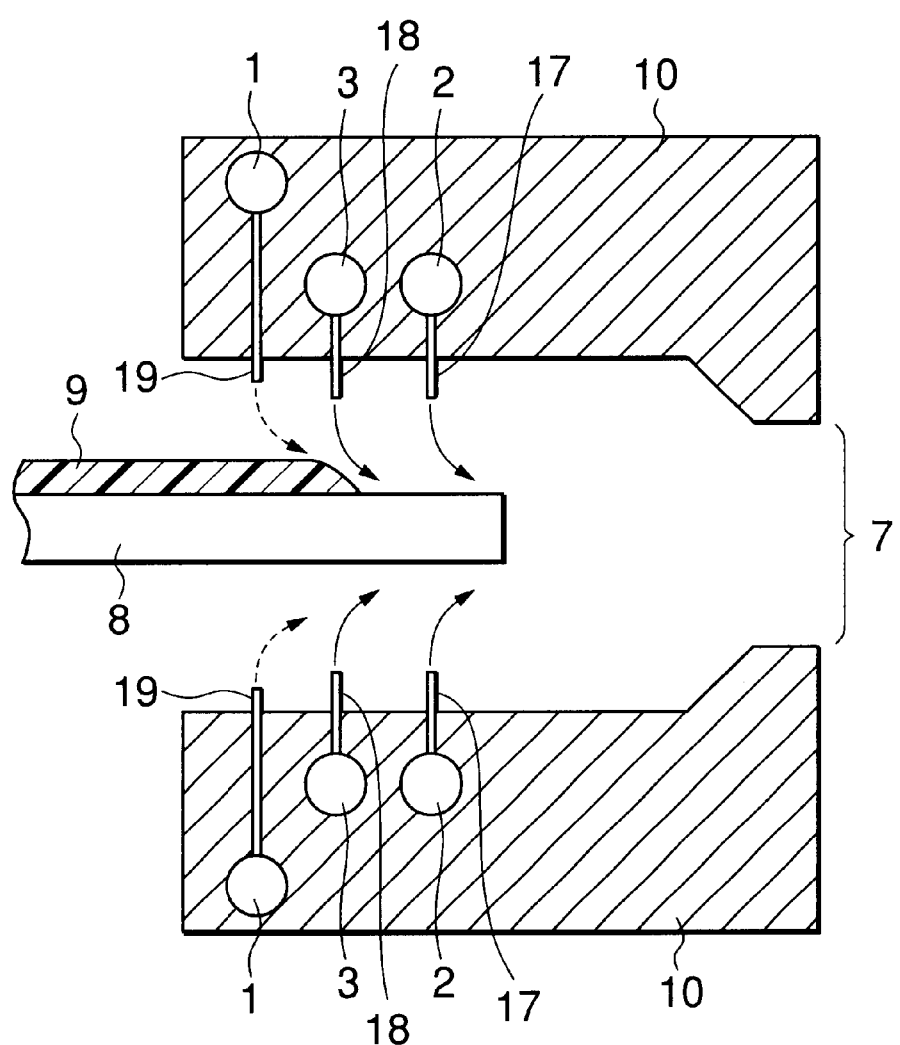
FIG. 11 shows a cross section of an EBR head according to a conventional example 2.
Figure 12:
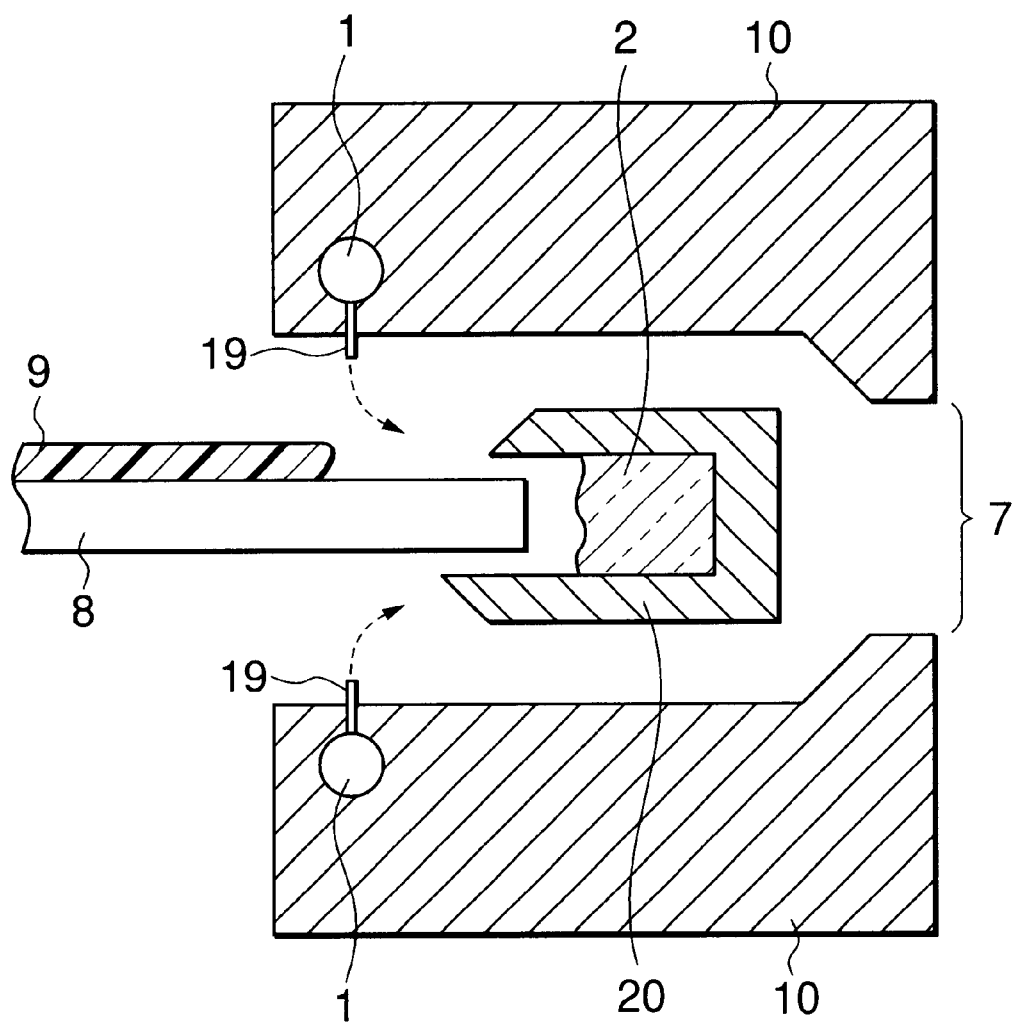
FIG. 12 shows a cross section of an EBR head according to a conventional example 3.
Figure 13:
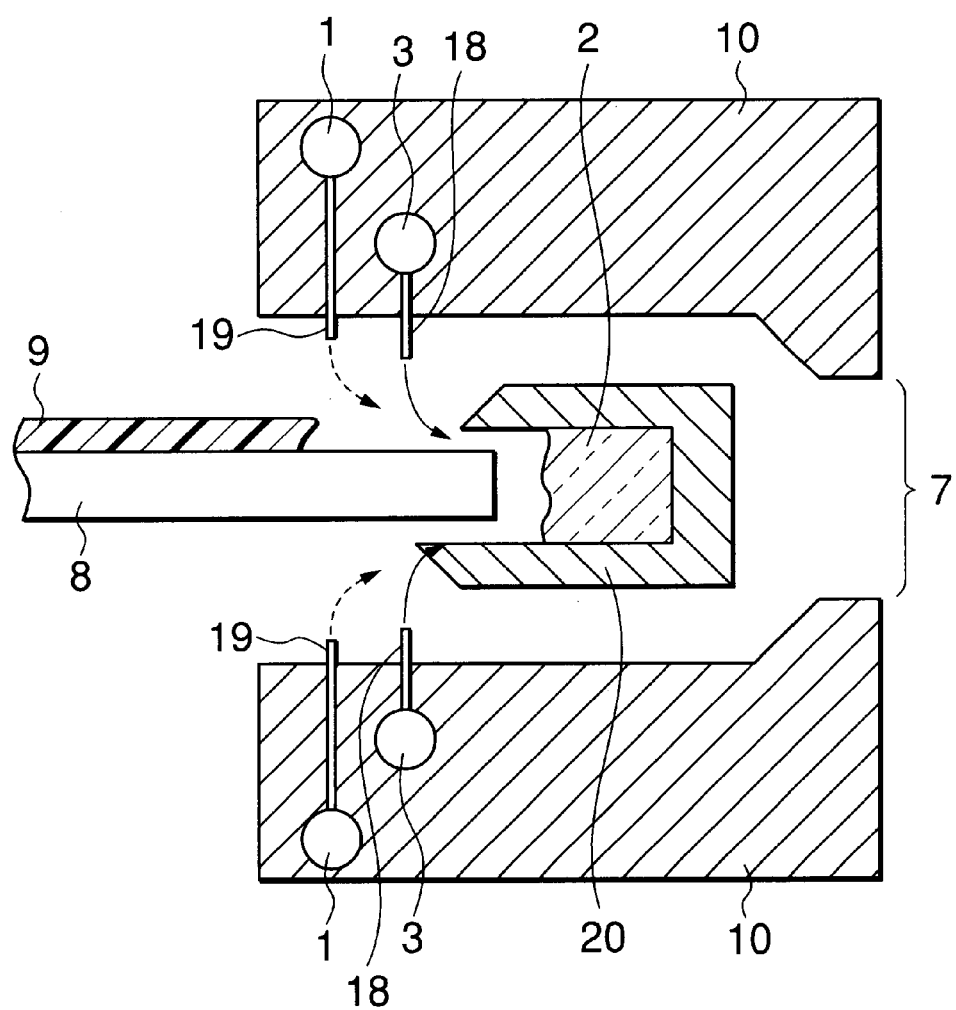
FIG. 13 shows a cross section of an EBR head according to a conventional example 4.

FIGS. 9A and 9B are a plan view and a cross section of an EBR head of assistance in explaining the sixth embodiment of the present invention. The EBR units comprising the slit type chemical rinse and blow nozzle 15 and a slit type pure water rinse and blow nozzle 16 are disposed adjacent each other so as to interpose one side of the glass substrate 8 to be carried. In particular, the width of the respective nozzles is longer than that of one side of the glass substrate 8, as in the case of the fifth embodiment.

In the fifth and the sixth embodiments, the width of the respective nozzles, that is, the opening length of the slit opening is preferably approximately 10 mm or more longer than the width of one of both sides of the substrate. The overall length of the opening length, therefore, is preferably approximately 20 mm or more longer than the substrate width.

The sixth embodiment chiefly has the advantage of reducing the processing time for removing a negative resist film, as in the case of the fifth embodiment.

As described above, in the present invention, the slit type blow nozzle covering a range more widely than the slit type rinse nozzle is used for blowing at high pressure. Even when the slit type nozzle ejects the chemical at high pressure, no mist is scattered to the inside of the substrate, the physical action on the coating film is functioned so as to improve the removing efficiency. The amount of the liquid used is reduced, and the processing time is reduced.

The slit type rinse nozzle ejects the chemical at high pressure so as to linearly, uniformly remove the coating film and the removed part section of the coating film is in substantially an isotropic form. At the end of the process, the slit type blow nozzle is used to blow high-pressure gas so that the liquid of the end surface is blown off and no liquid remains thereon.

The embodiments are described by taking the glass substrate as an example. The material for the substrate of a display panel, however, is not limited to glass and, needless to say, can be applied to an insulating transparent substrate such as plastic.

What is claimed is:

1. An apparatus for removing a coating film comprising:
   a chemical rinse nozzle having an opening ejecting, over a first range, a chemical dissolving a coating film around the perimeter of an end surface of a substrate formed with the coating film; and
   a slit type blow nozzle having a slit opening ejecting, at high pressure over a second range, gas to the substrate so as to remove the coating film dissolved by the chemical from the substrate, wherein,
   the second range covered by the blow nozzle is greater than the first range covered by the rinse nozzle,
   the chemical rinse nozzle comprises a slit type chemical rinse nozzle having an opening in slit form,
   the slit type chemical rinse nozzle is arranged between the slit type blow nozzle and the end of the substrate the slit type chemical rinse nozzle and the slit type blow nozzle is of integrated nozzle construction, and
   the integration of the slit type chemical rinse nozzle and the slit type blow nozzle by being separated by a common partition comprises a slit type chemical rinse and blow nozzle provided with a slit opening ejecting the gas and the chemical independently.

2. The apparatus for removing a coating film according to claim 1, wherein the slit type blow nozzle and the slit type chemical rinse nozzle have a slit opening extending along one side of the substrate, respectively, the length of each opening being longer than one side of the substrate.

3. The apparatus for removing a coating film according to claim 1, wherein the opening of the integrated nozzle construction is single.

4. The apparatus for removing a coating film according to claim 1, further comprising a slit type pure water rinse nozzle having a slit opening ejecting pure water adjacent the slit type blow nozzle and the slit type chemical rinse nozzle.

5. The apparatus for removing a coating film according to claim 7, wherein the slit type pure water rinse nozzle comprises a further slit type blow nozzle with a slit opening, the rinse nozzle and further blow nozzle together ejecting a mixture of the gas and the pure water.

6. The apparatus for removing a coating film according to claim 1, wherein,
   a first nozzle unit comprises a combination of the slit type chemical rinse nozzle and the slit type blow nozzle, and further comprising
   a second nozzle unit constructed by a combination of a slit type pure water rinse nozzle disposed adjacent to the slit type chemical rinse nozzle and having a slit opening ejecting pure water and a second slit type blow nozzle disposed adjacent to the slit type blow nozzle and having a slit opening ejecting gas,
   the first nozzle unit and the second nozzle unit being disposed adjacent each other along one side of the substrate, and
   carry means for carrying the substrate from the first nozzle unit to the second nozzle unit.

7. The apparatus for removing a coating film according to claim 6, further comprising a third and a fourth nozzle units having a same construction as that of the first and the second nozzle units, the first and the third nozzle units being disposed to interpose one side of the substrate, and the second and the fourth nozzle units being disposed to interpose one side of the substrate.

8. The apparatus of claim 1, wherein the gas is set to eject from the blow nozzle at a pressure higher than a pressure greater than a pressure at which the chemical is set to eject from the rinse nozzle.

9. An apparatus for removing a coating film comprising:
   a chemical rinse nozzle having an opening ejecting, over a first range, a chemical dissolving a coating film around the perimeter of an end surface of a substrate formed with the coating film; and
   a slit type blow nozzle having a slit opening ejecting, at high pressure over a second range, gas to the substrate so as to remove the coating film dissolved by the chemical from the substrate, wherein,
   the second range covered by the blow nozzle is greater than the first range covered by the rinse nozzle,
   the chemical rinse nozzle comprises a slit type chemical rinse nozzle having an opening in slit form,
   the slit type chemical rinse nozzle is arranged between the slit type blow nozzle and the end of the substrate, and
   further comprising a slit type pure water rinse nozzle having a slit opening ejecting pure water between the slit type blow nozzle and the slit type chemical rinse nozzle,
   wherein the integration of the slit type pure water rinse nozzle and the slit type blow nozzle by being separated by a common partition comprises a slit type pure water rinse and blow nozzle provided with a slit opening ejecting the gas and the pure water independently.

10. The apparatus for removing a coating film according to claim 9, wherein a nozzle unit comprising the slit type chemical rinse and blow nozzle, and the slit type pure water rinse and blow nozzle is disposed so as to interpose one side of the substrate to be carried.

11. The apparatus of claim 9, wherein the gas is set to eject from the blow nozzle at a pressure higher than a pressure greater than a pressure at which the chemical is set to eject from the rinse nozzle.

12. An apparatus for removing a coating from a substrate having a side length, film comprising:
   an integrated nozzle forming a slit type rinse nozzle positioned immediately adjacent a slit type blow nozzle,
   the rinse nozzle and the blow nozzle being separated by a common partition,
   the slit type rinse nozzle ejecting a chemical onto the coating for dissolving the coating from the substrate,
   the slit type blow nozzle ejecting a gas onto the substrate to remove the dissolved coating from the substrate,
   the slit type rinse nozzle and the slit type blow nozzle having openings sized to extend along one side of the substrate, a length of the slit type rinse nozzle opening and a length of the slit type blow nozzle opening both being greater than the side length of the substrate,
   wherein, the integration of the rinse nozzle and the blow nozzle provides a combination rinse and blow nozzle provided with a slit opening ejecting the gas and the rinse independently.

13. An apparatus for removing a coating film from a substrate having a side length according to claim 12, further comprising:

an exhaust port, the exhaust port positioned to exhaust the rinse ejected from the rinse nozzle and to exhaust the gas ejected from the blow nozzle.

14. The apparatus of claim 13, slits of the rinse nozzle and the blow nozzle being parallel to each other, and an opening of the exhaust port being approximately orthogonal to a longitudinal direction of the slits of the rinse nozzle and the blow nozzle.

15. The apparatus of claim 12, wherein the pressure the gas is set to eject from the blow nozzle is approximately 0.5 to 0.8 Mpa.

16. The apparatus of claim 12, wherein the gas is set to eject from the blow nozzle at a pressure higher than a pressure greater than a pressure at which the chemical is set to eject from the rinse nozzle.

* * * * *

UNITED STATES PATENT AND TRADEMARK OFFICE
CERTIFICATE OF CORRECTION

| | | |
|---|---|---|
| PATENT NO. | : 6,669,809 B2 | Page 1 of 1 |
| APPLICATION NO. | : 09/791793 | |
| DATED | : December 30, 2003 | |
| INVENTOR(S) | : Yoshiaki Hashimoto and Yasuyuki Sato | |

It is certified that error appears in the above-identified patent and that said Letters Patent is hereby corrected as shown below:

Title Page;

Under REFERENCES CITED at (56):

Add the following references:
JP06-097067
JP08-022128
JP01-253923
JP07-037804
JP08-250390
JP11-290792
JP11-257851
JP07-289973
JP05-031469

Signed and Sealed this
Nineteenth Day of July, 2011

David J. Kappos
*Director of the United States Patent and Trademark Office*